(12) United States Patent
Ohno et al.

(10) Patent No.: US 6,384,734 B1
(45) Date of Patent: May 7, 2002

(54) METHOD OF CONTROLLING IC HANDLER AND CONTROL SYSTEM USING THE SAME

(75) Inventors: Tomonori Ohno, Yokosuka; Mitsugu Kurihara, Yokohama, both of (JP)

(73) Assignee: Daito Corporation, Kanagawa (JP)

( * ) Notice: Subject to any disclaimer, the term of this patent is extended or adjusted under 35 U.S.C. 154(b) by 0 days.

(21) Appl. No.: 09/651,572

(22) Filed: Aug. 28, 2000

Related U.S. Application Data

(63) Continuation of application No. PCT/JP99/07413, filed on Dec. 28, 1999.

(30) Foreign Application Priority Data

Dec. 31, 1998 (JP) ............................................. 10-378549

(51) Int. Cl.⁷ ............................................. G08B 21/00
(52) U.S. Cl. ........................ 340/679; 324/757; 324/754; 73/720
(58) Field of Search ................................. 340/679, 674, 340/540; 324/757, 754; 73/727, 720

(56) References Cited

U.S. PATENT DOCUMENTS

| | | | | |
|---|---|---|---|---|
| 4,993,266 A | * | 2/1991 | Omura et al. ................. | 73/720 |
| 5,469,953 A | * | 11/1995 | Igarashi et al. .......... | 198/345.2 |
| 5,951,720 A | * | 9/1999 | Arakawa et al. ........... | 29/25.01 |
| 6,043,442 A | * | 3/2000 | Park et al. ................... | 209/573 |
| 6,076,737 A | * | 6/2000 | Gogami et al. ............. | 235/492 |
| 6,160,410 A | * | 12/2000 | Orso et al. ................... | 324/757 |
| 6,184,675 B1 | * | 2/2001 | Bannai ........................ | 324/754 |

FOREIGN PATENT DOCUMENTS

| | | |
|---|---|---|
| JP | 5-259242 | 10/1993 |
| JP | 6-25724 | 4/1994 |
| JP | 7-55879 | 3/1995 |
| JP | 8-292230 | 11/1996 |
| JP | 9-89983 | 4/1997 |
| JP | 10-227834 | 8/1998 |

\* cited by examiner

Primary Examiner—John A. Tweel
(74) Attorney, Agent, or Firm—Nixon & Vanderhye

(57) ABSTRACT

The step of comparing the pushing pressure developing when the pusher of a test hand presses an IC placed on the socket with the allowable press force calculated from the combined spring constant for the socket and IC, and the step of controlling the operation of the test hand at a pressure equal to or lower than the allowable press force on the basis of the result of the comparison are provided.

11 Claims, 3 Drawing Sheets

METHOD OF CONTROLLING IC HANDLER AND CONTROL SYSTEM USING THE SAME

CROSS-REFERENCE TO RELATED APPLICATIONS

This is a Continuation of Application PCT/JP99/07413, filed Dec. 28, 1999.

This application is based upon and claims the benefit of priority from the prior Japanese Patent Application No. 10-378549, filed Dec. 31, 1998, the entire contents of which are incorporated herein by reference.

This invention relates to a method of controlling the operation of a test hand for pressing down an IC device (hereinafter, referred to as an IC) properly on a socket according to the types of the IC and socket in an IC handler used for a semiconductor tester, a recording instrument and a controlling/operating system.

BACKGROUND OF THE INVENTION

An IC handler has been in common use as a semiconductor tester. In the IC handler, an IC transferred from the IC loader is placed on the socket of the measuring section. In this state, the pusher of the test hand presses the IC against the socket to bring the contact section of the IC, such as the lead pins, into contact with the contactor of the socket. From the result of electric conduction, the tester judges whether the IC characteristic is acceptable. Then, the unloader separates the IC from a reject and holds it.

In recent years, the types of ICs to be tested have been diversified and consequently the types of sockets to hold them have also been diversified. Thus, the operating performance of the test hand should be changed so as to deal with the type of IC. Since the semiconductor tester is requested to process many ICs in a short time, it is desirable that the IC handler should function at high speed. However, the faster the processing speed becomes, the more increase the impact of the pusher on the IC when the pusher is pressed against the IC, and thus the service life of the lead pins of the IC and the socket. contactor may become shorter.

To overcome those problems, a handler, which has been disclosed in Jpn. Pat. Appln. KOKAI Publication No. 9-89983, is developed. In this handler, the data of allowable contact pressure in each type of IC has been inputted in a FD (floppy disk) beforehand. When the operator specifies the type of IC, the CPU sends a signal to the control valve on the basis of the data from the FD, thereby the hydraulic cylinder pressure for driving the test hand can be adjusted.

Furthermore, Jpn. Pat. Appln. KOKAI Publication No. 10-227834 has disclosed a mechanism for making fine adjustments to the proper pressure, speed, and displacement of IC pressed into a socket according to the type of IC.

In the above methods currently in use, however, it is required to input IC handler data for each type of IC into the computer in advance. And what is more, these data may be obtained through experience based on the pin pressure per lead pin, the number of pins and the allowable displacement of the socket contactor.

However, since the IC is pressed down by the test hand as it is in a socket, it may not be assured that the values based on the specified data items are always proper. For example, as the working speed of the test hand is increased to process the IC at high speed, the impact on the IC happens and becomes larger when the test hand hits the IC package. In addition, the impact force is likely to exceed the material strength of the IC leads or socket contactor and do damage to the IC package.

BRIEF SUMMARY OF THE INVENTION

Accordingly, the object of the present invention is to provide an operation method and system for an IC handler to control properly the pushing pressure, operating speed and displacement of the test hand according to the types of IC and socket.

To achieve the foregoing object, the operating method of the working of test hand to control appropriately the pushing force, operating velocity and displacement thereof in the IC handler is invented.

In order to realize the above-mentioned object, the control method of the test hand for pushing the contact of the IC on the socket of the IC handler comprises the step of measuring data by means of sensors through the trial to press an IC on the socket repeatedly by the test hand, so as to obtain data representing the load, the acceleration or velocity, and the amount of thrusting displacement of the test hand until the stoppage thereof after the tip of the test hand contacts with the IC; obtaining the combined spring constant K of the IC socket; and determining the motion of test hand so as to work the impact force to an IC becoming smaller than the allowable press force.

Furthermore, a control system of the present invention comprises a load sensor for detecting the press force of the test hand applied to an IC; an acceleration sensor for detecting the operating velocity or acceleration of the test hand; a displacement sensor for measuring the thrusting displacement during the time from when the test hand comes into contact with the IC until it stops; and control means for not only calculating the combined spring constant for the IC and a socket on the basis of the data items from the individual sensors, but also controlling the driving of the test hand on the basis of the individual data items so that the press force, velocity, and displacement may reach such values that make the impact force acting on the IC equal to or smaller than an allowed value and speed up the operation of the test hand to the maximum.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
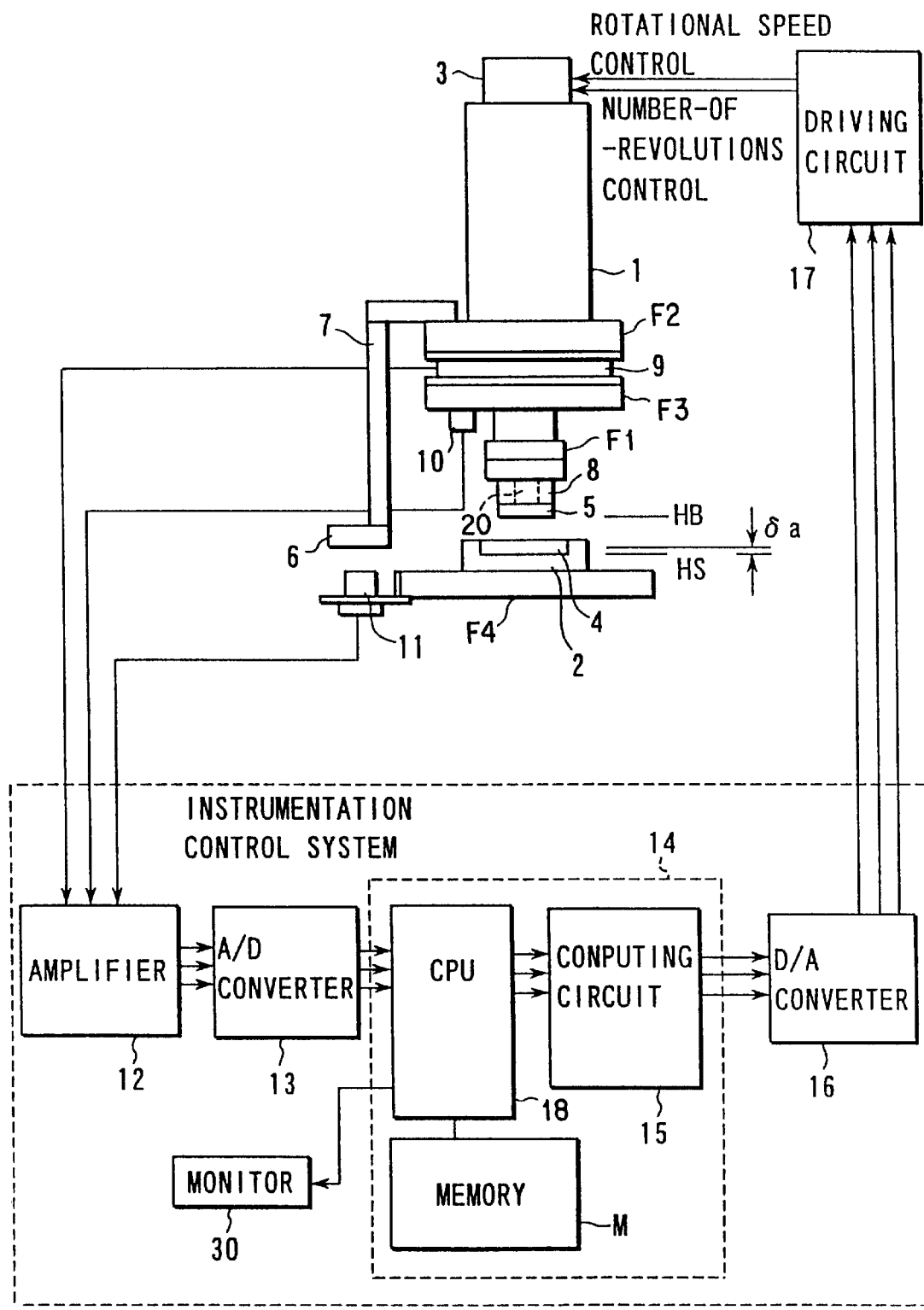
FIG. 1 illustrates a schematic block diagram of a test hand control system according to an embodiment of the present invention.

FIG. 1 is a block diagram showing the overall configuration of a control system for the test hand in an IC handler according to an embodiment of the present invention.

The upper half of FIG. 1 schematically shows an IC test section composed of a pulse motor 3, a driving circuit 17, a test hand 1, a pusher 8, an IC 5, a contactor 4, and a socket 2. At the tip of the test hand 1, a load sensor 9 using a strain gauge load transducer and a strain gauge accelerometer 10 are provided. A noncontacting displacement sensor 11 using an eddy-current displacement measuring device is provided on a frame F4 that supports the socket 2. A lightweight, rigid aluminum arm 7 to hold a target 6 of the displacement sensor 11 is provided above the pusher 8.

The lower half of FIG. 1 shows a system for collecting and processing the electric signals sent by the sensors 9 to 11. The control system is composed of an amplifier 12, an A/D converter 13, a computer 14, and a D/A converter 16. The electrical signals are digitized by the A/D converter and then the arithmetic process is executed by a computer. When the operation of the pulse motor 3 has to be adjusted, a control signal is sent to the driving circuit 17. Detailed explanation will be given below.

In FIG. 1, the pulse motor 3 is fixed on the top end of test hand body 1. At the lower end of the test hand body 1, the pusher 8 is provided in such a manner that it can move up and down freely. At the tip of the pusher 8, a suction hole 20 for causing the IC 5 to adhere to the tip by suction at air pressure is made. The suction hole 20 is connected to a compressor (not shown) via an air hole made inside the pusher 8 and test hand body 1.

Because the support plate F1 is joined to the pulse motor 3 and the pusher 8 is fixed onto the support plate F2 via a load sensor 9 and a frame F3, the pusher 8 and support plates F2, F3 are moved up and down as one piece by the pulse motor 3.

On the other hand, the socket 2 on the frame F4 is provided below the pusher 8. The contactor 4 is provided at the IC acceptor of the socket 2 so that it may touch the contacts of the IC 5, such as the leads.

The sensor arm 7, made of lightweight aluminum, is fixed rigidly to the frame F2. At the lower end of the sensor arm 7, the target 6 for a displacement sensor is provided in such a manner that it faces the displacement sensor 11 provided on the frame F4 on which the socket 2 is placed.

The acceleration sensor 10 is provided onto the lower frame F3 of the pair of frames F2, F3.

The test hand 1 has the pusher 8 at its lower end. Adhering the IC 5 by suction at its tip, the pusher 8 is moved up and down by the pulse motor 3. The test hand 1 can adjust the pushing pressure on the IC 5 and socket 2, the working speed, and the thrusting displacement of IC by controlling the number of revolutions and rotational speed of the pulse motor 3. As described later, the test hand 1 is designed to be decelerated just before the tip of the pusher 8 comes into contact with the socket 2 so as to alleviate its impact on the IC 5 and socket 2.

The load sensor 9 is for detecting the pushing pressure of the test hand 1, or the pusher 8, on the IC 5 and socket 2. The load sensor is provided between the frames F2 and F3. The acceleration sensor 10 is used for detecting the acceleration or a change of the velocity when the test hand 1 goes down. A strain gauge sensor or piezoelectric sensor may be used as the acceleration sensor 10. An acceleration sensor can be used in place of the velocity sensor. In this case, the velocity can be obtained by differentiating numerically the digitized data of displacement by means of the computer 14. The displacement sensor 11 is for measuring the displacement D from the position just before the IC 5 stuck by suction to the pusher 8 comes into contact with the contactor 4 of the socket 2 to the position at which the pusher 8 stops after being thrust down. In the embodiment, an eddy current noncontacting measuring device is used as the displacement sensor 11.

Hereinafter, the configuration of the control system for controlling the operation of the test hand 1 will be explained by reference to FIG. 1.

The pulse motor 3 and the compressor (not shown) are connected to the driving circuit 17, which controls the number of revolutions and rotational speed of each of them.

On the other hand, the output terminal of each of the load sensor 9, acceleration sensor 10, and displacement sensor 11 is connected to the amplifier 12. The amplifier 12 amplifies the faint electrical signal, which is then converted by the A/D converter 13 into a digital signal. The digital signal is supplied to the CPU 18 of the computer 14. The computer 14, which includes a computing circuit 15 connected to the CPU 18 and a memory M, controls the operation of the entire system. The memory M includes a ROM in which the operating programs for the CPU 18 are stored and a RAM for temporarily storing the data used in the computing circuit 15 is recorded.

The output data from the computing circuit 15 is converted by the D/A converter 16 into an analog signal, which is supplied as an instruction to the driving circuit 17 for operating the pulse motor 3 and compressor.

In the above system configuration, the amplifier 12 amplifies the faint analog electric signals from the sensors 9 to 11. The A/D converter 13 digitizes the amplified analog signals and sends the resulting signals to the computer 14. According to the setting program, the CPU 18 of the computer 14 will make the computing circuit 15 to perform the arithmetic processing for comparison the measured data with the stored data in the memory M and give an instruction the test hand 1 to do an optimum work correspondingly with the types of the IC 5 and socket 2. The operator can keep watch on the monitor 30 what the process is going in every time.

Hereinafter, referring to FIGS. 3 to 6, a state where the IC 5 is pressed against the contactor 4 of the socket 2 and the configuration of the socket 2 will be explained.

Figure 3:
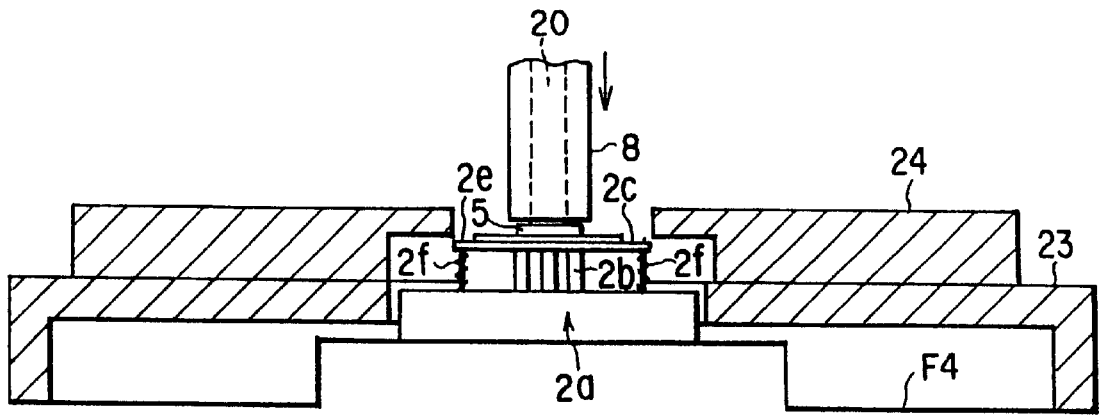
FIG. 3 shows a sectional view showing a state where the pusher provided at the tip of the test hand presses an IC against the socket.
Figure 5:
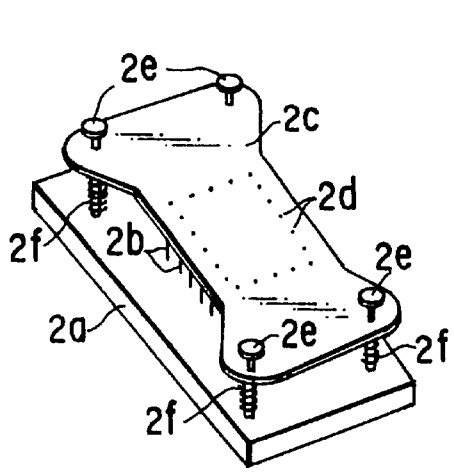
FIG. 5 shows a perspective view of an example of a socket used with the IC of FIG. 4.
Figure 6:
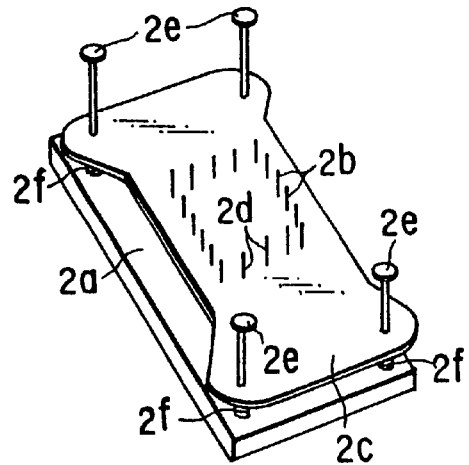
FIG. 6 is a perspective view showing a state where the pusher presses down the protective plate of the socket via the IC package, causing the contact pins of the socket of FIG. 5 to project from the protective plate.

In FIG. 3, the base 2a of the socket 2 is placed on the frame F4. As shown in FIGS. 5 and 6, contact pins 2b are set straight at the base 2a. The tips of the contact pins 2b are inserted into the through holes 2a made in a protective plate 2c.

The protective plate 2c are held above the base 2a by the four supports or protective pins 2e inserted into through holes made in the four corners of the plate 2c and the coil springs 2f provided around the protective pins 2e in such a manner that the plate 2c can move up and down. As shown in FIG. 5, the coil springs 2f are normally set so that they may have such tension as raises the protective plate 2c to the extent that the contact pins 2b will not project from the surface of the protective plate 2c.

When the IC 5 conveyed by an IC loader (not shown) is stuck by suction to the tip of the pusher 8 and placed on the socket 2 and the pusher 8 presses down the IC 5 on the socket 2, the protective plate 2c which allows the contact pins 2b to project from the surface to the protective plate 2c as shown in FIG. 6, is forced to move downward. FIG. 3 shows a state where the IC 5 stuck by suction to the tip of the pusher 8 has just come into contact with the protective plate 2c.

The socket 2 put on the frame F4 is fixed and protected by covers 23 and 24.

Figure 4:
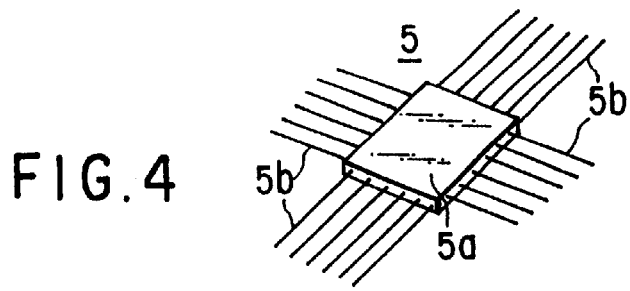
FIG. 4 shows a perspective view of an example of an IC to be tested.

As shown in FIG. 4, for example, the IC 5 has a square shape of thin flat-plate and a plural number of lead pins 5b are stuck out from each side of a plate.

In addition to the case shown in FIG. 4, there are various methods of securing an electrical connection between the IC and the socket. They include a spring contact method in which the IC's lead pins are brought into contact with the socket by the spring and a conductive rubber method in which the minute solder balls formed at one surface of the IC plate is brought into contact with the conductive particles embedded in a rubber socket (not shown).

While in the embodiment, the IC 5 is stuck by suction to the pusher 8 on the test hand 1, the IC may be placed on the socket directly from the IC loader so as to be pressed by the pusher.

The operation of the IC handler constructed as described above will be explained.

First, using the data from the sensors 9 to 11, the CPU 18 determines the pushing pressure, the allowable impact force, the working speed, and the thrusting displacement as follows.

Pushing Pressure

If the spring constant of the IC leads 5b is K1 and the resultant spring constant of coil springs 2f of the socket 2 is K2, a combined spring constant K can be obtained by adding the spring constant of the IC 5 and that of the socket 2 as follows:

$$K=(K1+K2)/K1 \cdot K2$$

Using the pushing pressure load P detected by the load sensor 9 with the pusher 8 in contact with the IC 5 and the thrusting displacement δ of the IC 5 measured by the displacement sensor 11 when the IC 5 is lowered a specific distance from the position where the pusher 8 makes contact with the IC 5 within the socket 2, the value of K is also given by:

$$K=P/\delta$$

Where, the thrusting displacement δ of the pusher 8 is the distance from the position of the pusher 8 when the acceleration of the pusher 8 changes from zero to a specific negative value at the moment the IC 5 comes into contact with the protective plate 2c to the position to which the pusher 8 is lowered a specific distance predetermined by the IC 5, or to the position at which the pusher 8 is brought to a stop by the computer 14 when the pushing pressure load P has exceeded a prescribed value. The thrusting displacement δ is the sum (δ=δ1+δ2) of the amount of deflection δ1 when the lead pins 5b of the IC 5 are pressed by the contact pins 2d of the socket 2 and the length of contraction δ2 of the coil springs 2f supporting the protective plate 2c. The values of δ1 and δ2 are determined by the spring constants K1 and K2, respectively.

Impact Force

When the IC 5 comes rapidly into contact with the protective plate 2c serving as the contactor 4, the impact force may be produced and can be evaluated from a change in the velocity (ΔV=V1−V0) of the pusher 8 during the time of Δt before and after the contact. The impulse force is given by:

$$F=m \cdot (\Delta V/\Delta t)$$

As seen from the above equation, if the velocity V0 of the pusher 8 before contact has been decreased sufficiently compared to the given working velocity of the test hand 1 and it could be kept constant until the IC 5 stuck by suction to the tip of the pusher 8 comes into contact with the protective plate 2c, the impact force at the time of contact can be extremely small or zero. In the above equation, ΔV/Δt is defined as the acceleration and it can be detected by the acceleration sensor 10.

On the other hand, the reaction force generated by the contact of the IC 5 with the socket protective plate 2c is equal to the pushing force P applied to the IC 5. The force P is detected by the load sensor 9 (load cell) provided above the pusher 8. Let the mass of the pusher 8 at the tip of the test hand 1m, the impact force F can be evaluated as the product of m and acceleration as shown in the above equation.

Working Velocity

The working velocity V(t) of the pusher 8 of the test hand 1 at a given time t can be evaluated from either the displacement data D(t) measured by the sensor 11 or the acceleration data A(t) measured by the sensor 10 as follows:

$$V(t)=\{D(t)-D(t-\Delta t)\}/\Delta t$$

$$V(t)=V(t-\Delta t)+A(t) \cdot \Delta t$$

Thrusting Displacement

The thrusting displacement δ(t) can be obtained from the data D(t) measured by the displacement sensor 11 as follows:

$$\delta(t)=D(t)-D(t-\Delta t)$$

On the other hand, the following data items have been inputted into the memory M of the computer 14 in advance:

(1) The working velocity V of the test hand 1 (pusher 8). This is determined by the number of revolutions and rotational speed of the pulse motor 3.

(2) The braking position HB and position to be stopped HS (see FIG. 1) of the test hand 1.

(3) The decreased velocity V0 of the pusher 8 after braking. This can be determined by regulating the number of revolutions and rotational speed of the pulse motor 3.

(4) The allowable thrusting displacement δa (the amount of displacement from the position where the IC 5 comes into contact with the protective plate 2c of the socket 2 to the position where the pusher 8 stops).

(5) The allowable pushing force Pa (evaluated from the thrusting displacement δ of the pusher 8 and the combined spring constant K).

Figure 2:
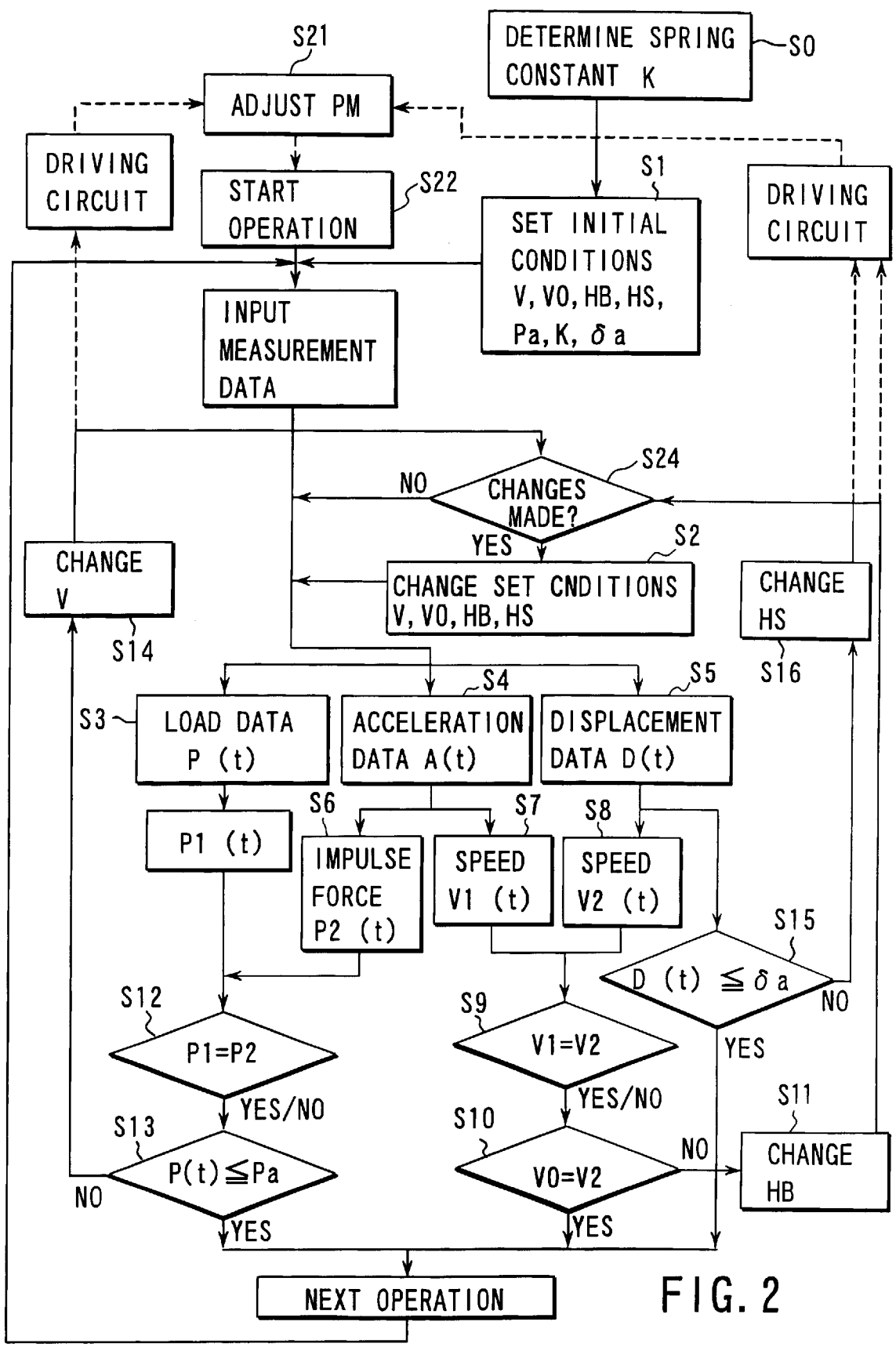
FIG. 2 shows a flowchart to explain the operation of the computer in the embodiment of FIG. 1.

The data processing and computing processes carried by the CPU 18 will be explained by reference to the flowchart of FIG. 2.

First, the pusher 8 of the test hand 1 presses repeatedly the IC 5 against the contactor 4 of the socket 2 or the protective plate 2c to measure the load P and displacement D, and then calculates the combined spring constant K of the IC 5 and socket 2 (step S0). The pushing pressure is set under the prescribed value given to the IC 5 and socket 2. Pressing the IC 5 more than once and averaging the results will minimize errors in the measured data of load P and displacement D, and then the more precise data may be obtained.

In the next step S1, the initial conditions, including the operating velocity V of the test hand 1, the braking position HB and the position to be stopped HS of the test hand 1, the decreased velocity V0 after braking, the allowable thrusting displacement δa, and the allowable pushing pressure Pa, are inputted together with the combined spring constant K obtained at step S0 into the memory M.

If necessary, the pulse motor 3 driven by the driving circuit 17 is adjusted at step S21.

After preparations for startup have been made, the operator turns on the start switch at step S22, which starts the control operation. Then, the pulse motor 3 rotates at high speed and the pusher 8 of the test hand 1 moves downward rapidly from the initial position. The CPU 18 checks the number of revolutions of the pulse motor 3 by counting the number of pulses sent from the driving circuit 17. When the number of pulses has amounted to the number corresponding to the braking position of the test hand 1, the CPU 18 sends the driving circuit 17 an instruction to brake the pulse motor 3.

At this stage, the CPU 18 takes in the input data from the sensors 9 to 11 at step S23. As a result, load data P(t), acceleration data A(t), and displacement data D(t) at time t are stored in the memory M at steps S3, S4, and S5, respectively.

Using acceleration data A(t) taken in at step S4, the decreased velocity V1(t) of the pusher 8 is determined at step S7. At the same time, using displacement data D(t) taken in at step S5, the alternative decreased velocity V2(t) of the pusher 8 is determined at step S8.

A check is made to see if the velocity V1(t) is equal to the velocity V2(t) at step S9. If the difference between them is within the allowable error range, one of the velocity data items, for example, V2(t) is compared with the initial velocity V0 after braking set at step S10. If the difference between them is within the normal range, the next operation will be proceeded.

When the measured velocity is larger than the initial set value V0, the change of the braking position HB is set at step S11. Then, the control proceeds from step S24 to step S2, where the braking position HB is changed to a position closer to the socket S2.

After the braking position HB has been changed, the data is taken in again and the velocity are compared at steps S4, S5, S7, S8, S9, and S10.

On the other hand, in parallel with this, the contact pressure force P(t) between the IC 5 and socket 2 is measured directly by the load sensor 9 at step S3. This measured load is assigned to P1(t). At step S6, the contact pressure force P(t) is calculated from the mass m of the pusher 8 and the acceleration A(t). The result of the calculation is P2(t). P1(t) is compared with P2(t) at step S12. Even when they are equal or differ slightly, the load, for example, P1 is compared with the allowable pushing pressure Pa in the memory M at step S13.

As a result, when P(t)≦Pa, or when the impact force is within the allowable range, the next operation is to be continued. If P(t) is larger than Pa, the number of revolutions or rotational speed V of the pulse motor 3 is decreased at step S14, and then control returns to step S24.

Furthermore, the displacement data D(t) obtained at step S5, which is the thrusting displacement of the IC 5 to the socket 2, is compared with the allowed value δa in the memory M. When D(t) exceeds δa, the change of the stop position HS of the pusher 8 of the test hand 1 is set at step S16, and control returns from step S24 to step S2. The change of HS is made by changing the stroke of the pusher 8 of the test hand 1, or the total number of revolutions from the start to stop of the pulse motor 3.

Watching the monitor 30 connected to the CPU 18, the operator can verify whether the operating speed of the pusher 8 is proper at step S10 or whether the operating states at steps S13 and S5 are acceptable. Therefore, when the original set values are proper, the operator uses them as they are, whereas when they are improper, the operator corrects them. Furthermore, the capability of the test hand 1 to process the IC 5 can be maximized by increasing the operating speed V of the test hand 1 in the range that meets the requirements at steps S13 and S15. Since the IC 5 stuck by suction to the pusher 8 at the tip of the test hand 1 comes into contact with the socket 2 and is slowed down to V0 immediately before it is lowered further, the impact force can be limited considerably even when the operating speed V is somewhat large.

As described above, the test hand can be operated properly in a short time even with different types of ICs and sockets by incorporating the control method and instrumentation control system of the present invention into an IC handler.

A method of controlling an IC handler according to the present invention and a control system using the method are used to cause a contact provided at the surface of an IC device to make good contact with the test probe of a semiconductor test unit in testing the IC device. The invention enables the operation to be performed quickly and accurately, which enables a large number of IC devices to be tested rapidly and accurately at the time of shipment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of controlling a test hand for pressing down an IC loaded in the socket of an IC handler, comprising the steps of:

causing said test hand to press down the IC on the socket more than once and detecting the load, the acceleration or velocity, and the thrusting displacement of the IC by corresponding sensors;

calculating the combined spring constant for the IC and socket from the measured data items beforehand; and determining the operation of the test hand from the calculated spring constant so that the impact force exerted on the IC is controlled to be equal to or smaller than an allowed value.

2. A method of controlling an IC handler comprising the steps of:

comparing a pushing pressure developing when the pusher of a test hand presses an IC placed on a socket with a preset allowable press force; and controlling the operation of the test hand at a press force equal to or lower than said allowable press force on the basis of the result of the comparison.

3. The method of controlling an IC handler according to claim 2, further comprising the step of calculating said preset allowable press force from the combined spring constant for the socket and IC beforehand.

4. The method of controlling an IC handler according to claim 2, further comprising the step of controlling said pusher in such a manner that the operating speed of said pusher is constant before and after said pusher comes into contact with the IC on said socket.

5. The method of controlling an IC handler according to claim 3, wherein the step of calculating the allowable press force from the combined spring constant for said socket and IC includes the step of taking the average of the combined spring constants obtained by causing said pusher to press the IC on said socket more than once.

6. An instrumentation control system for a test hand comprising:
- a load sensor for detecting the press force of the test hand applied to an IC;
- an acceleration sensor for detecting the operating velocity or acceleration of said test hand;
- a displacement sensor for measuring the thrusting displacement during the time from when said test hand comes into contact with the IC until it stops; and
- control means for not only calculating the combined spring constant for the IC and a socket on the basis of the data items from the individual sensors, but also controlling the driving of the test hand on the basis of the individual data items so that the press force, velocity, and displacement may reach such values that make the impact force acting on the IC equal to or smaller than an allowed value and speed up the operation of the test hand to the maximum.

7. The instrumentation control system according to claim 6, wherein said control means has a memory for storing the working velocity of the test hand, the braking position and stop position of the test hand, and the working velocity of the test hand after braking, the allowable thrusting displacement, and the allowable press force as initial conditions beforehand.

8. The instrumentation control system according to claim 6, wherein said allowed value is calculated by said control means from the thrusting displacement of the IC and said combined spring constant.

9. The instrumentation control system according to claim 8, further comprising means for moving said test hand to said braking position at high speed and, from said braking position on, moving said test hand at low speed.

10. The instrumentation control system according to claim 6, further comprising a monitor for displaying the contents of control performed by said control means.

11. The instrumentation control system according to claim 7, further comprising means for comparing said set initial conditions with the measured data items from said individual sensors and means for correcting said initial conditions when the result of the comparison has shown that said measured data items differ from said initial conditions.

* * * * *